United States Patent [19]

Nemcek, Sr.

[11] 4,103,231

[45] Jul. 25, 1978

[54] ELECTROMETRIC APPARATUS

[75] Inventor: Donald Stephen Nemcek, Sr., Roselle, Ill.

[73] Assignee: Cole-Parmer Instrument Company, Chicago, Ill.

[21] Appl. No.: 792,270

[22] Filed: Apr. 29, 1977

[51] Int. Cl.² ............................................. G01R 1/30
[52] U.S. Cl. ................................ 324/123 R; 330/203; 330/297
[58] Field of Search .................. 330/297, 202, 203; 307/297; 324/123 R; 323/23, 25

[56] References Cited

U.S. PATENT DOCUMENTS 3,252,086   5/1966   Lundstrom .................. 324/123 R X

OTHER PUBLICATIONS

Garment et al., "Low Cost Electrometer for Current Range $10^{-11}$–$10^{-5}$ A," Journal of Physics E: Scientific Instruments, 1971, vol. 4, pp. 707–708.

Messina, "Power Supply Regulator Uses Fewer Parts," Electronics, Jan. 6, 1969, p. 54.

*Primary Examiner*—James B. Mullins
*Attorney, Agent, or Firm*—Fitch, Even, Tabin & Luedeka

[57] ABSTRACT

An electrometric apparatus, which uses a measuring device that provides a high impedance dc signal which varies in accordance with the variable to be measured. The dc signal is amplified by at least one amplifier means and the amplified signal is applied to an indicating means which indicates the amplitude of the amplified dc signal. The supply voltage for the amplifier means is provided by a dc power supply means connected through a regulating means to positive and negative supply busses and for the amplifier means. The regulating means includes a transistor having its emitter-collector circuit connected in series between the power supply means and the positive supply bus of the amplifier means. A resistor and a Zener diode are connected in series and the series combination is shunt connected between the supply busses. A pair of series connected resistors are shunt connected between the supply busses. A programmable operational amplifier has one input connected to the junction between the resistor and the Zener diode and the other input connected to the junction between the series connected resistors. The output of the programmable operational amplifier is connected to the base of the transistor.

4 Claims, 1 Drawing Figure

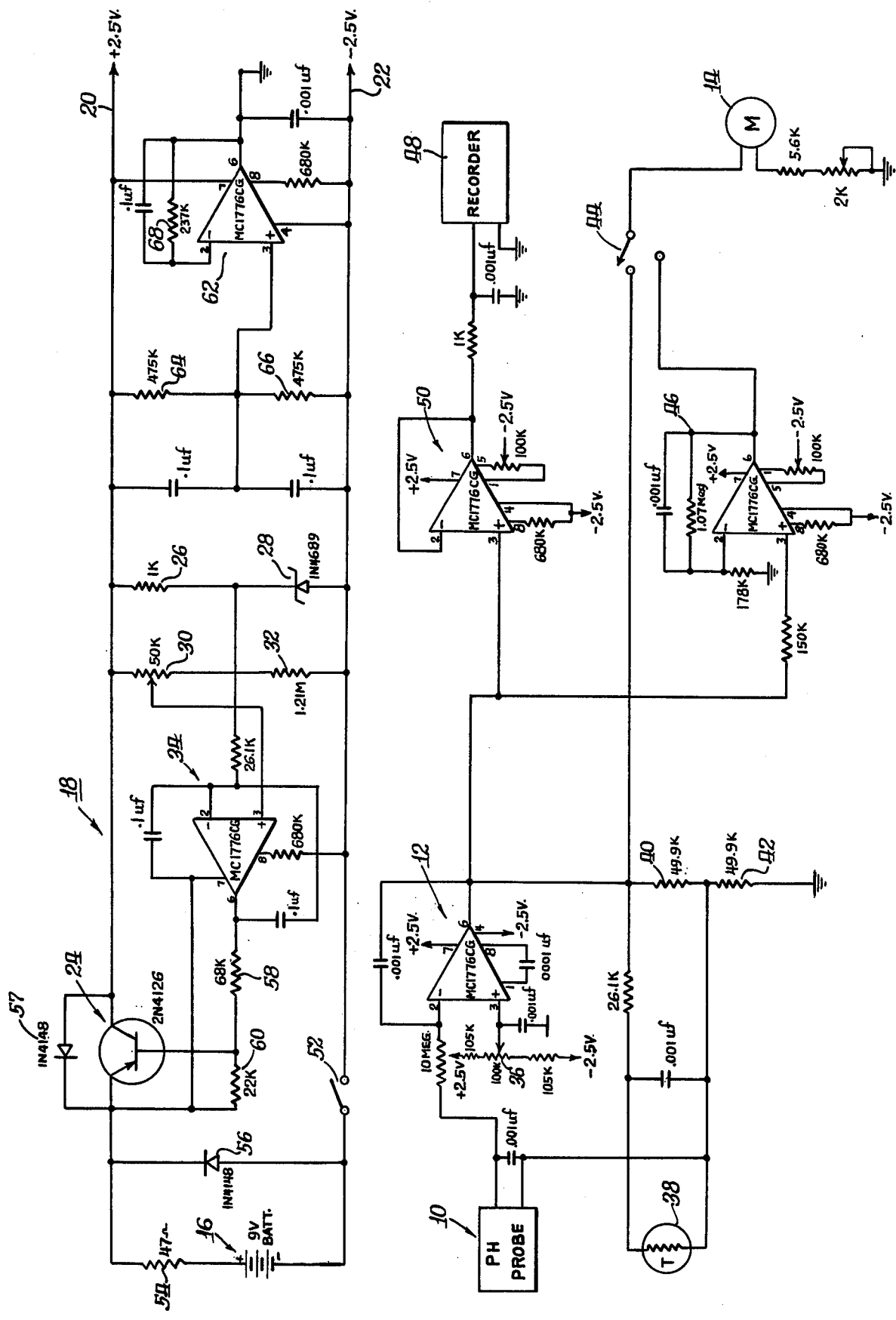

ELECTROMETRIC APPARATUS

The present invention relates to electrometric apparatus and more particularly to portable electrometric apparatus which has a low current drain.

Electrometric apparatus have been employed to measure various physical or chemical properties and, in recent years, have been manufactured so that they are portable and can be used by relatively untrained personnel. In making such electrometric apparatus portable, it is necessary for power to be supplied by batteries. Prior art electrometric apparatus have had a relatively high current drain and thereby have required that the battery be replaced quite often.

It is an object of the present invention to provide a portable electrometric apparatus which has a low current drain thereby affording relatively long battery life.

Other objects and advantages of the present invention will become apparent by reference to the following description and accompanying drawing wherein the FIGURE is a schematic circuit diagram of an electrometric apparatus.

Generally, as shown in the drawings an electrometric apparatus is provided, in accordance with the present invention, which uses a measuring device 10 that provides a high impedance dc signal which varies in accordance with the variable to be measured. The dc signal is amplified by an amplifier means 12 and the amplified signal is applied to an indicating means 14 which indicates the amplitude of the amplified dc signal. The supply voltage for the amplifier means 12 is provided by a dc power supply means 16 connected through a regulating means 18 to the supply busses 20 and 22 of the amplifier means 12. The regulating means 18 includes a transistor 24 having its emitter-collector circuit connected in series between the power supply means 16 and the positive supply bus 20 of the amplifier means 12. A resistor 26 and a Zener diode 28 are connected in series and the series combination is shunt connected between the supply busses 20 and 22. A pair of series connected resistors 30 and 32 are shunt connected between the supply busses 20 and 22. A programmable operational amplifier 34 has one input connected to the junction between the resistor 26 and the Zener diode 28 and the other input connected to the junction between the series connected resistors 30 and 32. The output of the programmable operational amplifier 34 is connected to the base of the transistor 24.

More particularly, the electrometric apparatus shown in the drawing is employed to measure pH. In this connection, the measuring device 10 is a pH probe which may be a conventional electrode type. The high impedance dc signal provided by the probe is amplified by connecting the probe to one input of the amplifier means 12 which serves as an input buffer and may be a conventional differential amplifier. The other input of the input buffer 12 is connected to the tap of a potentiometer 36 which applies a standardizing or zeroing voltage to the input buffer.

Temperature compensation is provided for the probe 10 by varying the gain of the input buffer 12 in accordance with the temperature to which the probe is exposed. In this connection, a thermister 38 that is mounted in a separate probe, and placed in solution with the probe 10 is shunt connected across one of a pair of series connected resistors 40 and 42 connected to the output of the input buffer 12. The junction between the series connected resistors 40 and 42 is connected to one of the electrodes of the probe to thereby provide voltage to the probe.

The dc voltage at the output of the input buffer 12 is measured by the indicating means 14 which may be a conventional dc meter connected through a switch 44 to the output of the input buffer 12.

The scale of the meter is expanded by connecting the output of the input buffer 12 to an amplifier 46 which may be a conventional programmable operational amplifier having a gain of seven and connected with a voltage offset null circuit. The output of the amplifier 46 is connected through the switch 44 to the meter 14. The dc output of the input buffer 12 is recorded by a recorder 48 connected through a recorder buffer amplifier 50 to the output of the input buffer 12. The recorder buffer amplifier 50 may be a conventional programmable operational amplifier having a gain of one and having a voltage offset null circuit.

The supply voltages for the three amplifiers 12, 46 and 50 are provided by the dc power supply means 16 which may be a conventional transistor radio battery. The battery 16 has its negative end connected to a normally open on-off switch 52. The positive terminal of the battery 16 is connected through a series resistor 54 to an emitter of the transistor 24 which is a pnp type and serves as a series voltage regulator. A clamp diode 56 is shunt connected across the resistor 54 and the battery 16 and is connected in polarity so that it prevents damage to the circuit by reverse connection of the battery. The collector of the transistor 24 is connected to the positive voltage bus 20 of the circuit and the other side of the on-off switch 52 is connected to the negative voltage bus 22 of the circuit. The positive voltage bus 20 is coupled to all of the positive voltage supply connections of the amplifiers 12, 46 and 50 and the negative voltage bus 22 is coupled to all of the negative voltage supply connections of the amplifiers. A clamp diode 57 is connected between the collector and emitter of the transistor 24 to protect the transistor from reverse currents during turn off.

Connected between the negative and positive busses 20 and 22 is the series connected resistor 26 and Zener diode 28 which circuit establishes a voltage reference for one input of the programmable operational amplifier 34. The Zener diode 28 is preferably a low current type such as an LVA device. The voltage reference for the other input of the programmable operational amplifier 34 is provided by the tap of the potentiometer 30 that is connected in series with the resistor 32, the series combination being connected between the positive and negative busses 20 and 22. The potentiometer is adjusted to provide a minimum of current into the Zener diode 28.

The output of the programmable operational amplifier 34 is connected through a series resistor 58 to the base of the transistor 24. The base of the transistor 24 is coupled to its emitter by a biasing resistor 60. To permit supply voltages to be supplied to the programmable operational amplifier 34 during startup, its positive supply voltage terminal is connected to the junction of the positive side of the battery 16 and the emitter of the transistor 24.

A ground reference is established for the positive and negative busses 20 and 22 by an operational amplifier 62 connected as a reference amplifier. The non-inverting input of the operational amplifier 62 is connected to the junction of two series connected resistors 64 and 66 which series combination is connected between the negative and positive busses 20 and 22. The output of the operational amplifier 62 is grounded and is applied through a resistor 68 to the inverting input of the operational amplifier.

The circuit shown in the drawing has a low current drain thereby affording long life to the transistor radio battery. In this connection, the illustrated circuit has a current drain of less than about 1 milliampere. This affords battery life from a nine volt transistor radio battery in excess of 500 hours. The illustrated power supply regulator circuit operates with a low quiescent current namely about 200 microamperes and is relatively inexpensive to build.

Various changes and modifications may be made in the above described electromagnetic apparatus without deviating from the spirit and scope of the present invention. Various features of the invention are set forth in the following claims.

What is claimed is:

1. Electrometric apparatus comprising a measuring device for providing a high impedance dc signal which varies in accordance with the variable to be measured, at least one amplifier means for amplifying said high impedance dc signal, indicating means connected to said amplifier means for indicating the amplitude of said amplified dc signal, a transistor radio battery, and regulating means having a low quiescent current connecting said battery to the supply terminals of said amplifier means for regulating the current supplied to said amplifier means, said regulating means including a transistor having its emitter-collector circuit connected in series with said battery and the supply terminals of said amplifier means, a resistor connected by one end to one of said supply terminals, a low current type Zener diode connected by one end to the other end of said resistor and by its other end to the other supply terminal of said amplifier means, a pair of series connected resistors shunt connected between said supply terminals, a programmable operational amplifier having one input connected to the junction between said resistor and said Zener diode and the other input connected to the junction between said series connected resistors, the output of said operational amplifier being connected to the base of said transistor.

2. Electrometric apparatus in accordance with Claim 1 wherein a second operational amplifier is provided having an output connected to ground, a pair of series connected resistors connected between said supply terminals, said second operational amplifier having its non-inverting input connected to the junction between said resistors and its output connected to its inverting input.

3. Electrometric apparatus in accordance with claim 1 wherein one of the series connected resistors is a potentiometer and the input of the programmable operational amplifier is connected to the tap of the potentiometer, the potentiometer being adjusted for a minimum current through the Zener diode.

4. Electrometric apparatus in accordance with claim 3 wherein a second operational amplifier is provided having an output connected to ground, a pair of series connected resistors connected between said supply terminals, said second operational amplifier having its non-inverting input connected to the junction between said resistors and its output connected to its inverting input.

* * * * *